(12) United States Patent
Gunasekar

(10) Patent No.: US 8,037,382 B2
(45) Date of Patent: Oct. 11, 2011

(54) MULTI-MODE PROGRAMMABLE SCAN FLOP

(75) Inventor: Aswin K. Gunasekar, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 74 days.

(21) Appl. No.: 12/540,872

(22) Filed: Aug. 13, 2009

(65) Prior Publication Data

US 2011/0041018 A1 Feb. 17, 2011

(51) Int. Cl.
*G01R 31/28* (2006.01)
(52) U.S. Cl. ........................ 714/726; 714/729
(58) Field of Classification Search .................. 714/726, 714/729
See application file for complete search history.

(56) References Cited

U.S. PATENT DOCUMENTS

| | | | | |
|---|---|---|---|---|
| 5,774,475 A * | 6/1998 | Qureshi | | 714/726 |
| 5,949,692 A | 9/1999 | Beausang et al. | | |
| 6,380,724 B1 * | 4/2002 | Mahurin et al. | | 324/73.1 |
| 6,587,981 B1 | 7/2003 | Muradali et al. | | |
| 7,146,551 B2 * | 12/2006 | Ghisiawan et al. | | 714/726 |
| 7,332,949 B2 * | 2/2008 | Kim | | 327/202 |
| 7,757,137 B2 * | 7/2010 | Ortiz et al. | | 714/726 |
| 2005/0253640 A1 * | 11/2005 | Kim | | 327/218 |
| 2006/0168490 A1 * | 7/2006 | McCormack et al. | | 714/726 |
| 2006/0197571 A1 * | 9/2006 | Kim | | 327/218 |
| 2007/0061647 A1 * | 3/2007 | Dhong et al. | | 714/726 |
| 2010/0289549 A1 * | 11/2010 | Shimizume et al. | | 327/185 |

OTHER PUBLICATIONS

Correale, Design Considerations of a static LSSD Polarity Hold Latch Pair, Jul. 1984, IBM, vol. 28, No. 4, pp. 370-378.*

* cited by examiner

*Primary Examiner* — John J Tabone, Jr.
(74) *Attorney, Agent, or Firm* — Meyertons, Hood, Kivlin, Kowert & Goetzel, P.C.; Erik A. Heter

(57) ABSTRACT

A scannable flop circuit configured for operation in a multiple modes. The scannable flop circuit includes a functional flop having a data input, a clock input, and a data output, a scan flop having a scan data input and a scan data output, and a latch circuit coupled between the functional flop and the scan flop. The latch circuit includes one or more mode signal inputs to enable selection of an operating mode. In a first mode, the latch circuit is configured to enable the functional flop to provide a data signal to the scan flop. In a second mode, the latch circuit is configured to enable the scan flop to provide a data signal to the functional flop. In a third mode, the latch circuit is configured to provide a feedback path in order to feed back to the functional flop a signal generated by the functional flop.

18 Claims, 7 Drawing Sheets

US 8,037,382 B2

MULTI-MODE PROGRAMMABLE SCAN FLOP

BACKGROUND OF THE INVENTION

1. Field of the Invention

This invention relates to integrated circuits, and more particularly, to scan elements used to provide access for testing integrated circuits.

2. Description of the Related Art

Scan testing is one of a number of different methods available for testing integrated circuits (IC's). Scan testing may be conducted using one or more internal scan chains each of which includes a plurality of serially coupled scan elements. A scan chain may be thought of as a serial shift register. A string of bits comprising test stimulus data may be input into a given scan chain of an IC by shifting each bit from one scan element to the next until each bit has reached its target element. Similarly, captured test result data may be shifted from the IC by shifting each bit of test result data from one scan element in the chain to the next until all bits of the test result data have been shifted into a test system or other receiving device. Shift operations may be synchronized using one or more scan clock signals, which may be separate from the one or more operational clock signals used by the IC during normal operations.

Each scan element may include a functional flop that is configured to perform operations during normal operation of the IC, as well as a scan flop. After test stimulus data has been shifted to a given scan element, it may be input into the functional flop through its corresponding scan flop. During testing, the functional flop may apply the test stimulus data to circuits connected thereto responsive to one or more cycles of an operational clock signal. The functional flop may also be coupled to receive test result data from other circuits coupled thereto. The scan element may capture the test result data upon the completion of testing, after which it may be shifted from the IC as described above.

SUMMARY OF THE INVENTION

A scannable flop circuit configured for operation in multiple modes is disclosed. In one embodiment the scannable flop circuit includes a functional flop having a data input, a clock input, and a data output, a scan flop, the scan flop having a scan data input and a scan data output, and a latch circuit coupled between the functional flop and the scan flop. The latch circuit includes one or more mode signal inputs to enable selection of an operating mode. In a first mode, the latch circuit is configured to enable the functional flop to provide a data signal to the scan flop. In a second mode, the latch circuit is configured to enable the scan flop to provide a data signal to the functional flop. In a third mode, the latch circuit is configured to provide a feedback path in order to feed back to the functional flop a signal generated by the functional flop.

An integrated circuit (IC) is also disclosed. In one embodiment, the IC includes one or more functional units at least one scan chain, wherein each of the scan chains includes a plurality of scan elements, wherein each of the scan elements is coupled to at least one of the one or more functional units. Each scan element of at least a subset of the plurality of scan elements includes a functional flop having a data input, a clock input, and a data output, a scan flop having a scan data input and a scan data output, and a latch coupled between the functional flop and the scan flop. The latch includes one or more mode signal inputs which may be used in selecting an operational mode for the corresponding scan element. In a first mode, a corresponding scan element of the subset is configured to enable the functional flop to provide a data signal to the scan flop. In a second mode, the corresponding scan element is configured to enable the scan flop to provide a data signal to the functional flop. In a third mode, the corresponding scan element is configured to provide a feedback path in order to feed back to the functional flop a signal generated by the functional flop.

BRIEF DESCRIPTION OF THE DRAWINGS

Other aspects of the invention will become apparent upon reading the following detailed description and upon reference to the accompanying drawings in which.

Figure 1:
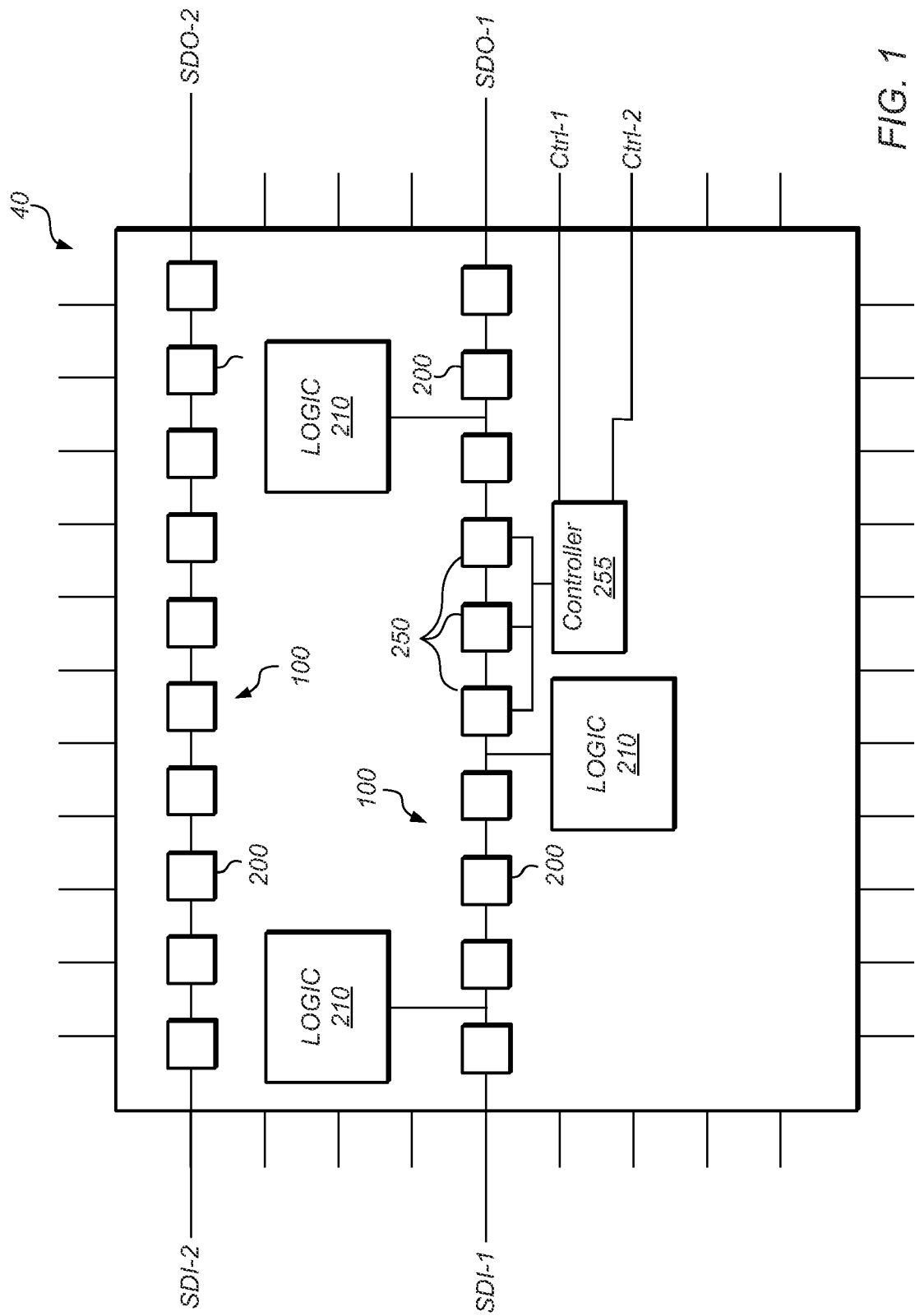
FIG. 1 is a block diagram of one embodiment of an IC including a plurality of scan chains.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION OF THE INVENTION

Integrated Circuit and Scan Chain Overview:

FIG. 1 is a block diagram of one embodiment of an IC including a plurality of scan chains is shown. In the embodiment shown, IC 40 includes two different scan chains 100. Each of the scan chains includes a plurality of serially coupled scan elements 200. At least one of the scan chains 100 also includes a plurality of scan elements 250, which may be configured differently than scan elements 200, as will be explained in further detail below. It is noted that IC 40 is an exemplary embodiment, and thus the number of scan chains 100, as well as the number of scan elements 200 and/or 250 in each scan chain 100, may vary from one embodiment to the next.

Each scan chain 100 in the embodiment shown includes a corresponding scan data input (SDI-1 for the lower chain, SDI-2 for the upper chain). Test stimulus data for a given scan chain 100 may be input through its corresponding scan data input. Test result data may be output from a given scan chain 100 through its corresponding scan data output. Since both scan chains 100 include a plurality of serially coupled scan elements 200/250, test stimulus data and test result data may be serially shifted through a corresponding scan chain 100, from one scan element to the next.

In the first one of the scan chains 100 in the embodiment shown in FIG. 1 (i.e. the lower scan chain), a plurality of logic units 210 are coupled thereto. Each logic unit 210 in the embodiment shown is coupled such that it may receive test stimulus data from the output of a scan element 200. Furthermore, each logic unit 210 may be coupled such that it may convey test result data to a scan element 200. Additional logic units 210 may be similarly coupled to scan elements 250, as well as the other scan elements 200 shown in both scan chains, although they are not explicitly shown here for the sake of simplicity. Accordingly, testing of logic units 210 may be conducted by conveying scan data to each logic unit 210 through a corresponding scan chain 100, operating IC 40 for one or more clock cycles, capturing the test result data, and shifting it from IC 40 (e.g., to a test system, where the test result data may be analyzed).

As noted above, scan elements 250 may be configured differently than scan elements 200. More particularly, scan elements 250 may be configured to operate in one of a number of different operational modes that are not available to scan elements 200. The modes may be selected by a controller 255 that is coupled to each of the scan elements 250. In the embodiment shown, controller 255 is coupled to receive two different control signals, Ctrl-1 and Ctrl-2, which may be used to input information for selecting the operational modes of scan elements 250. In some embodiments, these control signals may be dedicated signals, while in other embodiments, the signals may be provided via a JTAG (joint test action group) controller that may have other uses as well. Generally speaking the number, type, and manner of providing control signals to controller 255 may vary from one embodiment to the next.

Figure 2:
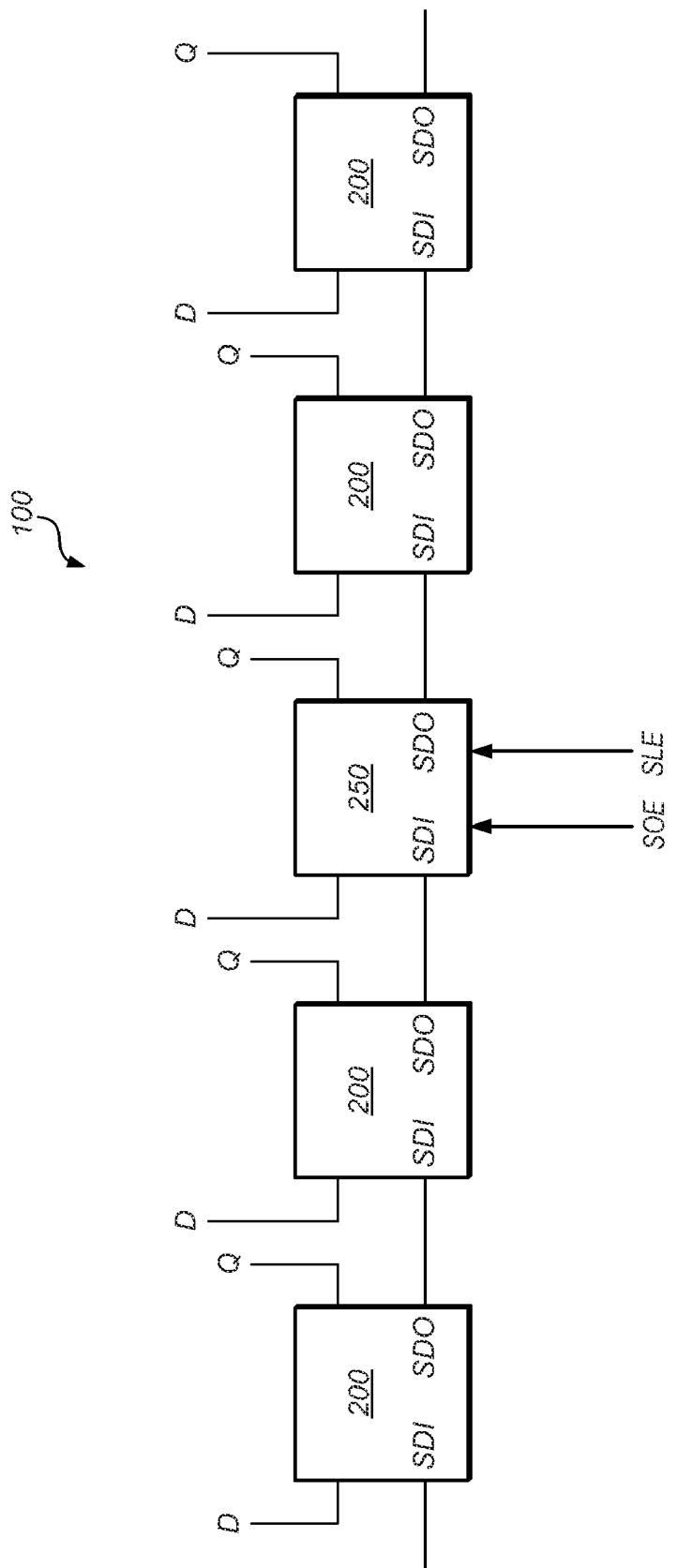
FIG. 2 is a block diagram of one embodiment of a scan chain.

Turning now to FIG. 2, a block diagram of one embodiment of a scan chain is shown. In the embodiment shown, scan chain 100 includes a plurality of scan elements 200 and a scan element 250. The particular number of scan elements 200 and 250 may vary from one embodiment to the next, and it should be noted that scan chains 100 comprised of one type of scan element (200 or 250) are also possible and contemplated.

Each scan element 200 and 250 in the embodiment shown includes a scan data input (SDI) and a scan data output (SDO). Test stimulus data and/or test result data may be shifted through the scan chain from one scan element to the next, e.g., from the scan data output of one scan element 200/250 to the scan data input of another scan element 200/250. Test stimulus data may enter scan chain 100 via the scan data input of a first scan element (a scan element 200 in this embodiment) and exit scan chain 100 through the scan data output of a last scan element (also a scan element 200 in this embodiment).

Each of the scan elements 200/250 in the embodiment shown may include a functional flop circuit having a data input 'D', and a data output 'Q'. The functional flop circuit in each of scan elements 200/250 is a flop circuit intended for use during normal operations (i.e. when not testing). The functional flops of each scan element 200/250 may be used for applying test stimulus data to other logic circuits coupled thereto, via a respective Q output. Accordingly, test stimulus data received through the scan data input of a given scan element 200/250 may be conveyed to the corresponding Q output for application to logic circuits coupled thereto. The functional flops of each scan element 200/250 may also be used for capturing test stimulus data, via a respective D input. Thus, test result data may be received by each scan element 200/250 through its corresponding D input, where it may then be conveyed to its respective scan data output.

As previously noted, scan element 250 may be configured differently than scan elements 200. In the embodiment shown, scan element 250 is coupled to receive two different signals, scan output enable (SOE) and scan load enable (SLE). These signals may be used in the selection of a particular operating mode for scan element 250, although other signals may also be involved in the selection of at least some of the operating modes. Additional details of the use of these signals, the various operating modes of scan element 250, and the uses of these modes will now be discussed with reference to FIGS. 3-7.

Figure 3:
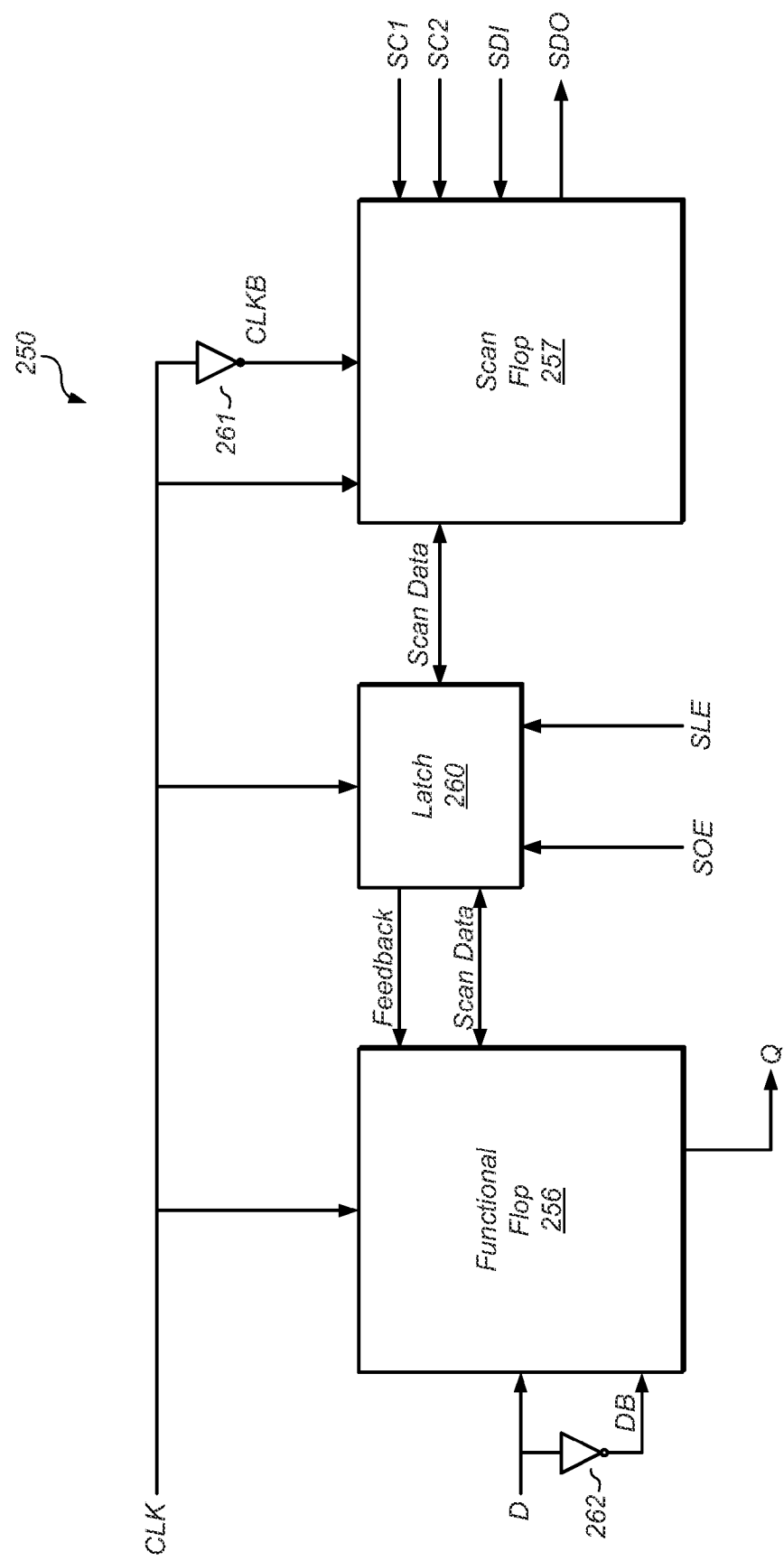
FIG. 3 is a block diagram of one embodiment of a scan element.

Configurable Scan Element Block Diagram:

FIG. 3 is a block diagram of one embodiment of a scan element 250. In this particular embodiment, scan element 250 is an LSSD (level sensitive scan design) type scan element. Furthermore, scan element 250 may be configured to operate at any given time in one of several different operating modes, depending on the state of one or more input signals SOE, SLE, SC1 (scan clock 1), and SC2 (scan clock 2).

In the embodiment shown, scan element 250 includes a functional flop 256, a scan flop 257, and a latch 260 coupled to each. Functional flop 256 may be one of several different types of flip-flop circuits in various embodiments, although it is a D-type master-slave flip flop in this particular embodiment. Accordingly, functional flop 256 may be coupled to receive input data through the D input, and may provide output data through the Q output. In addition, the D input may also be coupled to inverter 258 so that a complementary input, DB (for D-bar) may be provided to functional flop 256 (through inverter 262 in this example). Although not explicitly shown here, functional flop 256 may also be configured to provide a complementary output (Q-bar) signal. Functional flop 256 is also configured to receive a clock signal, CLK, which may be an operational clock circuit for the IC in which scan element 250 is implemented. During normal (i.e. non-test operations), functional flop 256 may receive data through its D (or D-bar) input, and may provide output data through its Q output (and also through a Q-bar output, if present).

Scan flop 257 in the embodiment shown may be used to input test stimulus data into and output test result data from scan element 250. Test stimulus data may be input into scan element 250 through the scan data input of scan flop 257. Test result data may be output from scan element 250 through the scan data output of scan flop 257. During shifting operations, scan flop 257 may operate in synchronization with scan clock signals SC1 and SC2, which may operate in alternating cycles (e.g., SC1 may be high when SC2 is low, and vice versa). It should be noted however that scan element 250 may also be implemented as a mux-D (multiplexer-D) scan element, wherein the SC1 and SC2 inputs may be eliminated.

Scan element 250 also includes a latch 260 in the embodiment shown. In the embodiment shown, latch 260 is coupled to receive the clock signal, along with the SOE and SLE signals. The various operations performed by latch 260 (and scan element 250 overall) may be determined at least in part by the states of the SOE, SLE, and clock signals. Latch 260 is coupled to both functional flop 256 and scan flop 257, and may allow data to be propagated between these two units. Latch 260 is coupled such that it may receive data from or convey data to scan flop 257. Furthermore, latch 260 may also convey data to or receive data from functional flop 256. In the embodiment shown, latch 260 also provides a feedback path in order to feed back to functional flop 256 a signal generated thereby.

Scan flop 257 is also coupled to receive both the clock signal and, via inverter 261, the complement of the clock signal, CLKB in this embodiment. When CLK is low (and CLKB is high), scan flop 257 may be enabled to convey data to or receive data from latch 260.

As previously noted, scan element 250 may be configured to operate in one of several different modes. For the embodiment shown, these modes are as follows:

1) Full Scan;
2) No Scan;
3) Scan Load Only;
4) Scan Observe Only;
5) Scan Shift Protect;
6) Scan Flush Reset;
7) Scan Toggle Reset; and
8) Scan Flush and Scan Toggle Reset.

In the Full Scan mode, test stimulus data may be loaded into the scan element for scan testing. The test stimulus data may be applied by functional flop 256 to circuitry coupled to its Q output. The test may be conducted, after which test result data may be received through the D input of functional flop 256 and thus captured by scan element 250. Subsequent to the capture of test result data, it may be shifted through the scan chain and from the IC as described above.

In the No Scan mode, scan element 250 may be inhibited from loading scan data into functional flop 256, even when scan data is being shifted through a scan chain in which it is a part. Similarly, scan element 250 may also be inhibited from providing data (e.g., captured data) from functional flop 256 to scan flop 257. Accordingly, test stimulus data is not loaded and test result data is not captured in the No Scan mode for the embodiment shown in FIG. 3. However, scan data may be enabled to propagate through scan flop 257, from the input SDI to the output SDO during operation in the No Scan node. Thus, scan element 250 may effectively operate in a bypass mode during the No Scan mode, allowing scan data to be propagated through the scan chain even if scan element 250 itself is not a targeted scan element for load and/or capture. In contrast to prior art embodiments, wherein an external multiplexer may be provided to enable bypassing a particular scan element in a scan chain, the embodiment of scan element 250 allows the bypassing of scan data without requiring an external multiplexer. During operation of scan element 250 in the No Scan mode, a signal generated by functional flop 256 (e.g., Q-bar) may be fed back into functional flop 257 through latch 260.

In the Scan Load Only mode for the embodiment shown, data may be loaded into functional flop 256 from scan flop 257 (via latch 260), but test result data is not captured. This may enable the testing of circuitry coupled to the Q output of functional flop 256. However, operation in this mode may prevent the observation of test result data of circuitry coupled to the D input of functional flop 256. Accordingly, the Scan Load Only mode may be useful in situations where it may be desirable for scan element 250 to apply test stimulus data to circuitry coupled to its output, but not to capture test result data from circuitry coupled to its input.

In the Scan Observe Only mode, the embodiment shown inhibits data from being loaded into functional flop 256. However, the Scan Observe Only mode for this embodiment may allow the capture of data by scan element 250. More particularly, data from circuitry coupled to the D input of functional flop 256 may be captured and loaded into scan flop 257, where it may subsequently be shifted out during scan shifting operations. This mode may be useful when it is desirable to observe the state output by circuitry coupled to the D input of functional flop 256 (e.g., a state resulting from a test), but wherein it is not required that circuitry coupled to the Q output of functional flop 256 receive test stimulus data. Similar to operation of scan element 250 in the No Scan mode, a signal generated by functional flop 256 (e.g., Q-bar) may be fed back into functional flop 257 through latch 260 when operating in the Scan Observe Only mode.

Operation in the Scan Shift Protect mode in the embodiment shown may enable the loading of test stimulus data into functional flop 256 without changing the state of its output. In some cases, the output of functional flop 256 may be coupled to an input of a one-hot multiplexer having other inputs. Accordingly, it is possible that output state (i.e. of the Q output) of functional flop 256 could change during scan shifting such that more than one input of the one-hot multiplexer may be asserted. This may cause undesired operation, since one-hot multiplexers are typically configured such that only one input is asserted at a given time. Moreover, other cases may exist where it may be desirable to protect a given output state of functional flop 256 during scan shifting. Therefore, placing scan element 250 in the Scan Shift Protect mode during scan shifting operations may allow for the loading of test stimulus date into functional flop 256, while protecting the state of its output such that undesired operation does not occur.

The Scan Flush Reset mode may allow for a fast reset of a long scan chain having a large number of scan elements 250. When operating in the Scan Flush Reset mode, scan flop 257 may be configured such that its scan data input is effectively transparent to its scan data output. This in turn may allow for a fast reset, as a logic value input to the scan data input of a first scan element in the scan chain may propagate quickly through to the scan data output of a last scan element of the scan chain. In embodiments wherein a number of scan elements 250 make up a consecutively coupled subset of scan elements in a larger scan chain having other types of scan elements (e.g., such as in FIG. 1), the subset may be operated in the Scan Flush Reset mode, while the other scan elements may be reset according to their particular configuration.

Another reset mode that may be used for scan element 250 is the Scan Toggle Reset mode. During operation in the scan toggle mode, the reset value may be input into the scan data input of scan flop 257. The scan clocks, SC1 and SC2 may then be toggled in alternating cycles in order to cause the reset value to propagate to the scan data output. For a chain of scan elements 250, a reset value may be input into the scan data input of a first scan element 250 of the scan chain. The scan clocks SC1 and SC2 may be toggled in alternating cycles, thereby allowing the reset value to propagate from one scan element 250 to the next. Performing a reset in the Scan Toggle Reset mode may thus require more time than a reset performed in the Scan Flush Reset Mode. However, a lesser amount of current may be drawn during a Scan Toggle Reset compared with that of a Scan Flush Reset.

The Scan Flush and Scan Toggle Reset mode may allow a combination of resets to be performed. In one embodiment, The Scan Flush and Scan Toggle Reset mode may be performed by holding high one of the scan clock signals (e.g., SC1), while toggling the other scan clock signal (e.g., SC2). Accordingly, when operating in this mode, a scan element 250 may effectively perform a flush-type reset as described above, but may do so in a toggled manner according to the scan clock that is cycled.

In the embodiment shown in FIG. 3, the various modes discussed above may be entered using at least the scan load enable and scan output enable signals. Additional modes may require other signals to be placed in certain states. Table 1 below lists the signal states required for the various operational modes for the embodiment of FIG. 3:

TABLE 1

| Mode | SLE | SOE |
|---|---|---|
| Full Scan | 1 | 1 |
| No Scan | 0 | 0 |

TABLE 1-continued

| Mode | SLE | SOE |
| --- | --- | --- |
| Scan Load Only | 1 | 0 |
| Scan Observe Only | 0 | 1 |
| Scan Shift Protect | SLE = 0 during shifting, 1 at load | 1 |
| Scan Flush Reset | 1, during reset with SC1 & SC2 HI | 1 |
| Scan Toggle Reset | 1 during reset, with SC1 & SC2 alternating | 1 |
| Scan Flush/Toggle Reset | 1 during reset with SC1 & SC2 HI/ alternating | 1 |

It should be noted that while the embodiment of FIG. 3 is configured to operate in certain modes, other embodiments are possible and contemplated wherein a configurable scan flop is capable of operating in a greater number of modes, a lesser number of modes, and/or one or more modes different from those discussed above.

Figure 4:
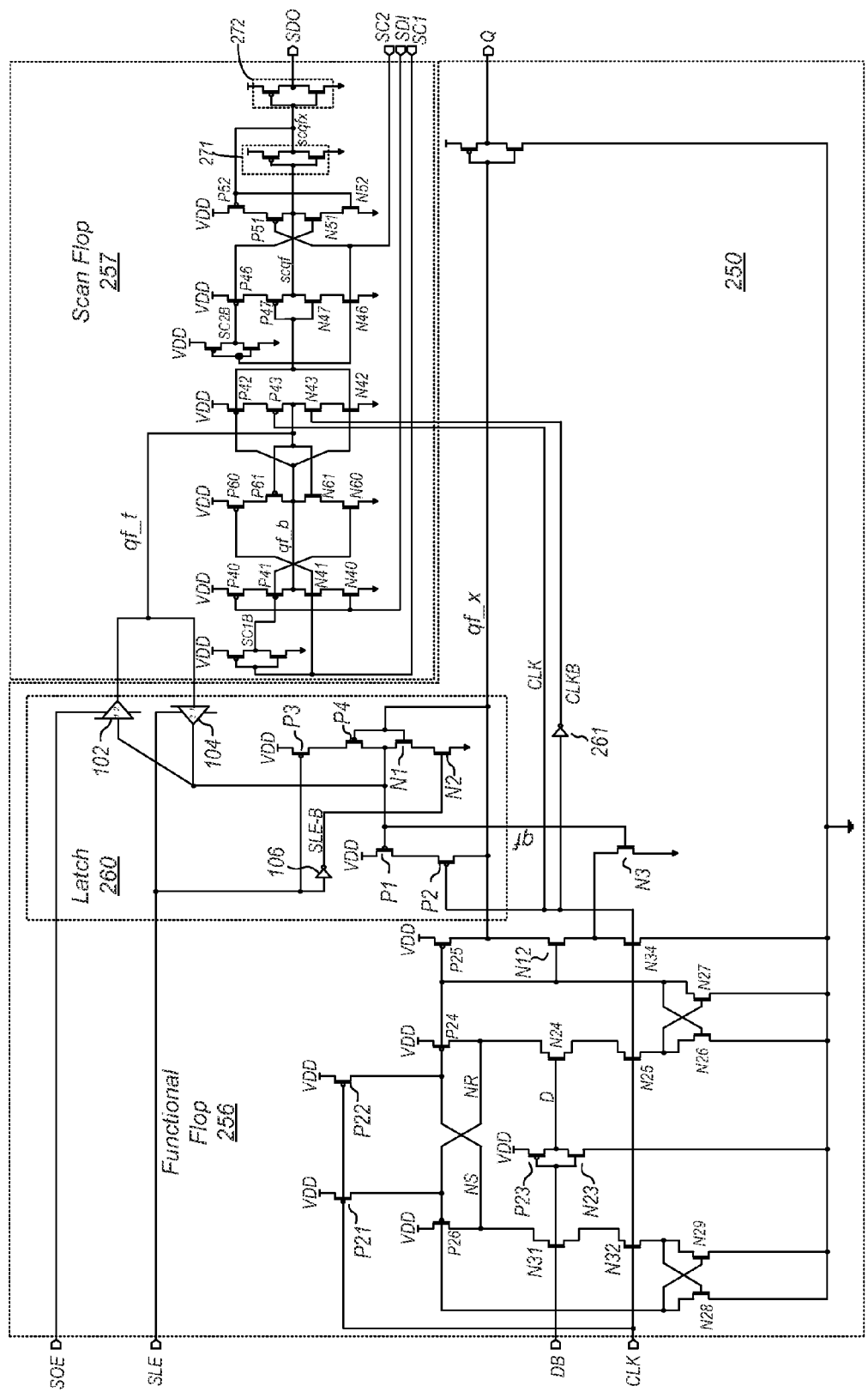
FIG. 4 is a schematic diagram of one embodiment of a scan element.

Configurable Scan Element Schematic Diagram:

FIG. 4 is a schematic diagram of one embodiment of a scan element. It should be noted that for the purposes of explaining this particular embodiment, PMOS (p-channel metal oxide semiconductor) transistors are designated with a 'P' (e.g., 'P1', etc.), while NMOS (n-channel metal oxide semiconductor) transistors are designated with an 'N' (e.g., 'N1', etc.). Embodiments using PMOS transistors in place of NMOS, and vice versa, in various portions of the circuit are possible and contemplated, as are other circuit arrangements. It should also be noted that the embodiment shown (as well as the embodiments illustrated in other drawings) is one of many possible embodiments that may fall within the scope of this disclosure. It is further noted that, for the sake of simplicity, not all transistors are labeled, as the operation of some circuit portions will be readily apparent to one skilled in the art. At times, certain mnemonics will be used to refer to particular circuit nodes (e.g., CLK, qf_x), while at other times, these mnemonics will be used to refer to actual signals. Generally speaking, a particular mnemonic may refer to either a node or a signal that is conveyed on that node.

Similar to the embodiment shown in FIG. 3, scan element 250 in the embodiment of FIG. 4 includes a functional flop 256, a scan flop 257, and a latch 260. In this particular example, both functional flop 256 and scan flop 257 are configured in a master-slave arrangement. In the embodiment shown, the left-hand portion of the functional flop 256 comprises the master portion, while the right-hand portion of functional flop 256 comprises the slave portion. Functional flop 256 in this embodiment is also configured for precharge operations. In this particular example, nodes NS and NR may be precharged through transistors P21 and P22, respectively, when the clock signal is low. After the clock signal transitions high, one of nodes NS or NR will fall low, depending on the state of the input DB. If DB is high, node NS will fall low responsive to CLK transitioning high. If DB is low, node NR will fall low responsive to CLK transitioning high. If NS falls low, node qf_x will be pulled high through transistor P25. Otherwise, if NR falls low (and NS is thus high), qf_x will be pulled low through transistors N12 and N34.

Latch 260 in the embodiment shown is coupled to receive the SLE and SOE signals. As previously noted, latch 260 may be configured to provide a feedback path for a signal generated by functional flop 256, wherein the signal is qf_x in this particular embodiment. When both SLE and CLK are low, transistors P3 and N2 may be turned on. Thus, transistors P4 and N1 may form an inverter, with qf_x as the input and qf, the complement of qf_x, as the output. If qf is low, transistor P1 may become active, while transistor N3 may become active if qf is high. Since CLK is low in this example, both nodes NS and NR will be precharged high, which in turn may result in transistor N12 being turned on. Accordingly, if N3 is turned on as a result of a high on qf, qf_x may remain low through the pull-down path existing through N12 and N3. Conversely, if qf is low, transistor P1 may become active, thus providing a pull-up path through P1 and P2 (active due to the low CLK). Accordingly, when both CLK and SLE are low in the embodiment shown, a feedback path exists to form a keeper circuit, thereby holding the value of qf_x. In this particular circuit, SLE is low during the No Scan Mode, the Scan Observe Only mode, and when the circuit is in its normal (i.e. non-test) operational mode. Accordingly, whenever CLK is low in one of these modes, the feedback path described above may be active, thereby holding the current value of qf_x.

When SLE is high, the feedback path is cut off due to transistors P3 and N2 being turned off in this embodiment. Furthermore, when SLE is high, buffer 104 is enabled to pass the signal present on node qf_t to node qf. If CLK is low when SLE is high, qf_x may switch to the opposite state of qf depending on the state of transistors P1 and N3. If qf is low, transistor P1 may turn on, and since the low clock turns on transistor P2, a pull-up path will exists between qf_x and VDD in this example. Accordingly, a low loaded onto node qf when SLE is high and CLK is low may cause node qf_x to transition high. Conversely, a high is loaded onto node qf with SLE is high and CLK is low, transistor N3 may become active, and thus node qf_x may be pulled to ground through transistors N3 and N12 (which may be active due to the precharge on node NS that occurs when CLK is low).

In order to load test stimulus data into functional flop 256 from scan flop 257, the test stimulus data may first be loaded through SDI. When the test stimulus data is applied to SDI, one of transistors P40 or N40 may become active. If a high is applied to SDI, N40 may become active, and when SC1 toggles high, node qf_b will be pulled low through N40 and N41. Otherwise, if a low is applied to SDI, P40 may become active, and toggling SC1 high may cause node qf_b to be pulled high through P40 and P41. Since CLK is low during scan load operations, P43 and N43 may also be active. Thus, if qf_b falls low as a result of the test stimulus data applied to SDI, P42 becomes active and node qf_t may thus be pulled high through P42 and P43. If node qf_b is pulled high as a result of the test stimulus data applied to SDI, node qf_t is pulled low through N43 and N42. The logic value conferred on node qf_t may then propagate through buffer 104 when it is enabled by a high on SLE.

When SOE is high, buffer 102 is enabled to convey the logic value on node qf to node qf_t. The signal conveyed on node qf_t may then be applied to the gate terminals of transistors P61 and N61. Transistors P60 and N60 may be on when SC1 is low. Accordingly, a low on node qf_t may result in node qf_b being pulled high through transistors P60 and P61. Conversely, a high on node qf_t may result in node qf_b being pulled low through transistors N60 and N61. The logic value on node qf_b may in turn propagate to the gate terminals of transistors P47 and N47. When SC2 toggles high, a complement of the logic value on node qf_b may be conferred upon node scqf. If a low is present on node qf_b, node scqf may be pulled high through transistors P46 and P47. If a high is present on node qf_b, node scqf may be pulled low through transistors N46 and N47. The logic value on node scqf may then be inverted twice (by inverters 271 and 272) in the embodiment shown, before being driven from scan flop 257 through the SDO pin. The data value held on SDO may be held via a keeper that is effectively formed when SC2 is low. Node scqfx is coupled to the gate terminals of P52 and N52 in the embodiment shown. Transistors P51 and N51 are arranged such that both may be active when SC2 is low. Accordingly, when SC2 is low, a pull-up path through P51 and P52 to VDD exists for node scqf if node scqfx is low, while a pull-down path to ground through N51 and N52 exists for node scqf if node scqfx is high. Accordingly, the logic values present on nodes scqf and scqfx (which are complements of each other in this embodiment) are held when SC2 is low, and thus the value of SDO may be held as well.

When operating in the Full Scan mode, both the SLE and SOE signals may be asserted. When both the SLE and SOE signals are asserted (e.g., logic high) in the embodiment shown, buffers 102 and 104 are enabled, while the feedback path through transistors P4 and N1 is cut off, as transistors N2 and P3 are inactive due to the high on SLE. Accordingly, during shift operations in a scan chain including scan element 250, data provided to the SDI pin may propagate to the Q output of functional flop 256, as well as to the SDO pin of scan flop 257. When buffer 102 is enabled, latch 260 may effectively form a keeper circuit that hold the current logic values on node qf and qf_t.

When the embodiment shown is operating in the No Scan mode, both SLE and SOE may be de-asserted (e.g., logic low). With SLE and SOE both de-asserted, buffers 102 and 104 may inhibit the transfer of signals between node qf and node qf_t. Data may still propagate through scan flop 257 while scan shifting is conducted in the No Scan mode, but data is not transferred between functional flop 256 and scan flop 257.

Operation in the Scan Load Only mode may be conducted in the embodiment shown by asserting SLE while de-asserting SOE. When SLE is asserted and SOE is de-asserted, buffer 104 may be enabled while buffer 102 is disabled. In such a configuration, signals may propagate from node qf_t to node qf, but not in the reverse direction. Accordingly, when operating in the Scan Load Only mode, latch 260 may enable data to be loaded from scan flop 257 into functional flop 256, but may inhibit data from being loaded from functional flop 256 into scan flop 257.

When operating in the Scan Observe Only mode in the embodiment shown, SOE may be asserted while SLE is de-asserted. Accordingly, buffer 102 may be enabled while buffer 104 is disabled. Thus, data may be conveyed from node qf_to node qf_t, but may not be conveyed in the Scan Observe Only mode. Thus, in the Scan Observe Only mode, data may be loaded from functional flop 256 into scan flop 257, but latch 260 may inhibit scan flop 257 from loading data into functional flop 256.

In the embodiment shown, operation in the Scan Shift Protect mode may be accomplished by holding SLE low during shifting until the required data has been loaded into scan flop 257. After loading the data into scan flop 257, SLE may be asserted for an amount of time sufficient to allow the state of node qf_t to propagate through buffer 104 to node qf. Since SLE is held low in this example (and thus, buffer 104 inhibits the movement of data from node qf_t to node qf), the Q output pin of functional flop 256 may remain undisturbed during the shifting of data through scan flop 257. Furthermore, if CLK is held low when SLE is also held low, the feedback path discussed above may be enabled, thereby effectively forming a keeper that holds the value of qf_x (and thus Q) in the state that was present when the feedback path became active. Once shifting is complete, the data loaded into scan flop 257 may then be loaded into functional flop 256, and any subsequent testing may be conducted.

To perform a reset in the Scan Flush Reset mode in the embodiment shown, both scan clocks, SC1 and SC2, may be held high. When SC1 is held high in this embodiment, transistors P41 and N41 are active, thereby allowing a pull-up path from qf_b to VDD or a pull-down path from qf_b to ground, depending on the data provided on SDI. When SC2 is held high, transistors P46 and N46 may also be active, thereby providing either a pull-up path or a pull-down path for node scqf, depending on the state of node qf_b. If node qf_b is low, node scqf may be pulled high when SC2 is high, while node scqf may be pulled low if node qf_b is high. The state of node scqf may be inverted twice (by inverters 271 and 272) and provided to the SDO pin. Thus, since both SC1 and SC2 are held high in the Scan Flush Reset mode, the logic value input into the SDI pin effectively propagates asynchronously to the SDO pin. Furthermore, if CLK, SOE and SLE are held high during operations in Scan Flush Reset mode, the data value input into scan flop 257 may also propagate through latch 260 and to the Q output of functional flop 256. Accordingly, operation in the Scan Flush Reset mode may provide a means of quickly resetting both the scan flops 257 and functional flops 256 of a chain of scan elements 250.

A reset using the Scan Toggle Reset mode may be performed for the embodiment shown by alternately toggling scan clock signals SC1 and SC2. The movement of data through scan flop 257 from the SDI pin to the SDO pin may follow the same path as in the Scan Flush Reset mode. In the Scan Toggle Reset mode, the movement of data through scan flop 257 may be synchronized to the scan clock signals SC1 and SC2. Accordingly, performing a reset in the Scan Toggle Reset mode may require more time than a reset performed in the Scan Flush Reset mode. However, operation in the Scan Toggle Reset mode may consume less current than operation in the Scan Flush Reset mode, and may be free of the L(di/dt) issues that may occur with a large, fast draw of current.

The Scan Flush/Toggle Reset Mode may combine operations of the previous two modes. In one embodiment, the Scan Flush/Toggle Reset mode may be accomplished by holding one of the scan clock signals high (e.g., SC1) while toggling the other scan clock signal (e.g., SC2). Since SC1 is held high in this example, data present on the SDI pin may cause a change of state to node qf_b without any delay incurred by waiting for a low-to-high transition of SC1. When SC2 transitions high, nodes scqf, scqfx, and SDO may transition responsive to any transition that previously occurred on node qf_b. As an alternative, operation in the Scan Flush/Toggle Reset mode may be accomplished by holding SC2 high and toggling SC1. When operating in this particular configuration, a state present on the SDI pin may ripple through scan flop 257 when SC1 transitions high, without waiting for SC2 to transition high since it may already be held in this state. In either case, a reset performed in the Scan Flush/Toggle Reset mode may allow for a faster reset than is possible in the Scan Toggle Reset mode, but may also allow for a reset without the L(di/dt) issues that may occur when performing a reset in the Scan Flush Reset mode.

Figure 5:
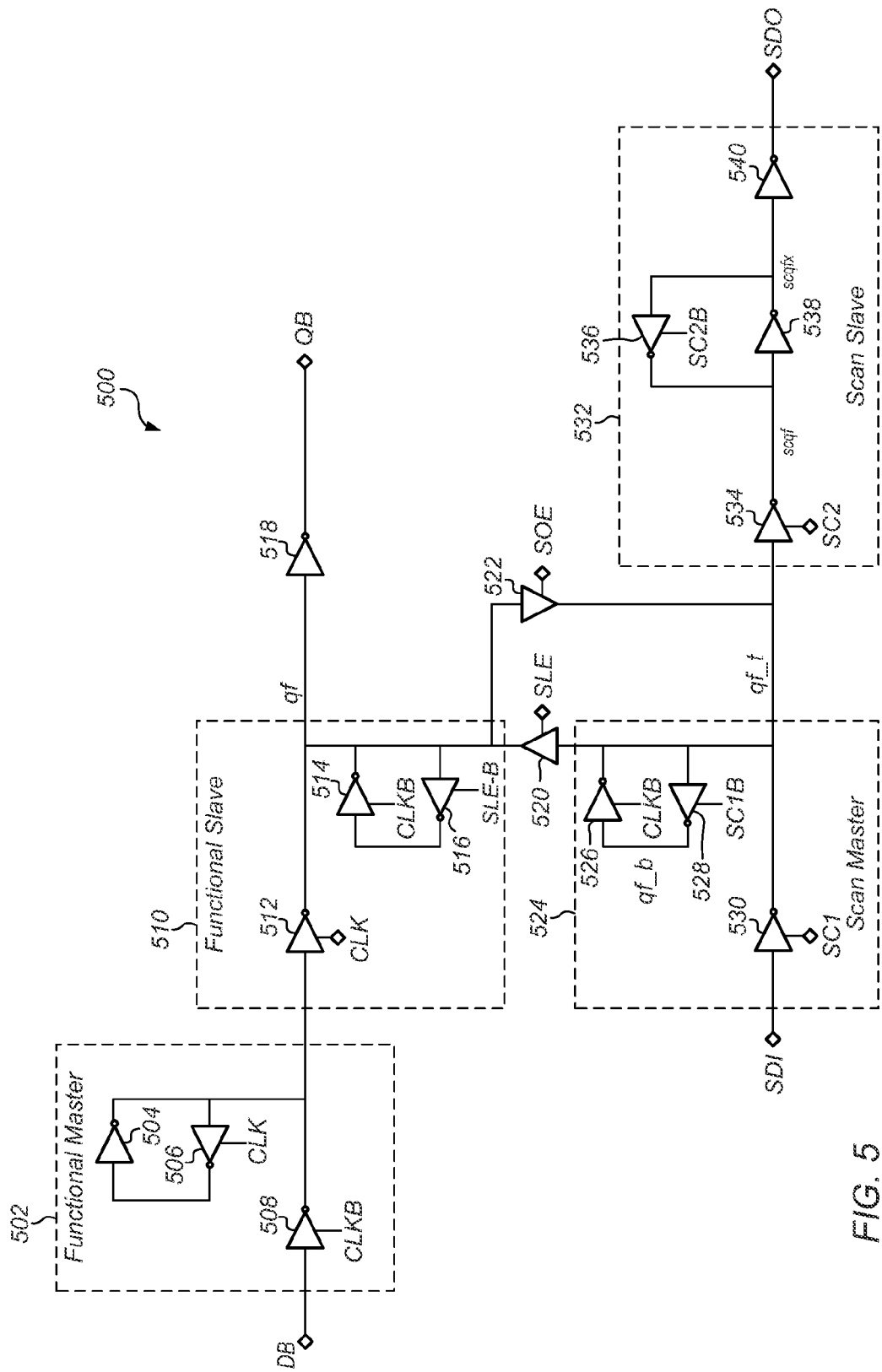
FIG. 5 is a logic diagram of one embodiment of an LSSD (level sensitive scan device) scan element.

Logic Diagrams of Various Embodiments:

FIG. 5 is a logic diagram of one embodiment of an LSSD (level sensitive scan device) scan element. More particularly, FIG. 5 is a logic diagram that may be used to illustrate some of the logical relationships of the circuit discussed above in reference to FIG. 4. In the embodiment shown, scan element 500 is an LSSD-type scan element configured for operations similar to those described above. Scan element 500 in the embodiment shown includes a functional flop that is comprised of functional master 592 and functional slave 510. A scan flop is also included in the embodiment shown, including a scan master 524 and a scan slave 532. A latch circuit coupling the functional flop to the scan flop may include buffers 520 and 522. Buffer 520 in this embodiment may be enabled when SLE is asserted, and disabled when SLE is de-asserted. Similarly, buffer 522 may be enabled when SOE is asserted and disabled when SOE is de-asserted.

In the embodiment shown, data may be loaded into scan master 524 (i.e. onto node qf_t) when scan clock SC1 his high, via buffer 530. When SC1 is low, buffer 530 may be disabled, thereby blocking data from being conveyed from the SDI pint to qf_t. Data from node qf_t may be conveyed from node qf_t into scan slave 532 by asserting SC2 and thus enabling buffer 534. A keeper formed by inverters 536 and 538 may cause the states of nodes scqf and scqfx to be retained when SC2 is low (and thus its complements, SC2B is high, thereby enabling inverter 536).

In the embodiment shown, functional master 502 is coupled to receive a complementary data signal, DB, in lieu of the true data signal D. Functional master is further configured in the embodiment shown to output a complementary output signal, QB, instead of the true output signal. However, as will be appreciated by those skilled in the art, the true data signal may be provided by adding inverter to the DB input while the true output may be provided by adding an inverter to the QB output. The complementary data input may be loaded into functional master 502 when the clock is low, and thus CLKB is high, thereby enabling inverter 508. Functional slave 510 may be loaded with data when the CLK is high, when inverter 512 is enabled. Additionally, when CLK is high, a keeper circuit may be formed of inverter 506 (enabled when CLK high) and inverter 504. The state of node qf may be retained when both the clock is low (when CLKB is high, thereby enabling inverter 514) and SLEB (i.e. when SLE is low, thereby enabling inverter 516) is high, forming a keeper with the enabled inverters. The complementary output state QB may result from the inversion of the state of node qf through inverter 518.

Scan element 500 may be configured to operate in various operational modes, as noted above. Operation in the Full Scan mode may include the assertion of both SLE and SOE, thereby enabling both inverters 520 and 522, respectively. To operate in the No Scan Mode, both SLE and SOE may be de-asserted. Scan element 500 may operate in the Scan Load Only mode when SLE is asserted and SOE is de-asserted. The Scan Observe Only mode may be enabled by asserting SOE and de-asserting SLE. Operation in the Scan Shift Protect mode may be achieved by holding SLE low during shift operations, while subsequently asserting SLE at the end of scan shifting when the desired state is present on node qf_t.

A reset according to the Scan Flush Reset mode may be accomplished by holding both SC1 and SC2 high. If SLE is held high during operation in the Scan Flush Reset mode, the output of functional slave 510 (and thus the functional output of scan element 500) may be reset as well. A reset according to the Scan Toggle Reset mode may be accomplished by alternately toggling scan clocks SC1 and SC2, which may toggle data through scan master 524 and scan slave 532. A combination reset according to the Scan Flush/Toggle Reset mode may be accomplished by holding one of the scan clock signals high (e.g., SC1), while toggling the other scan clock signal (SC2).

Figure 6:
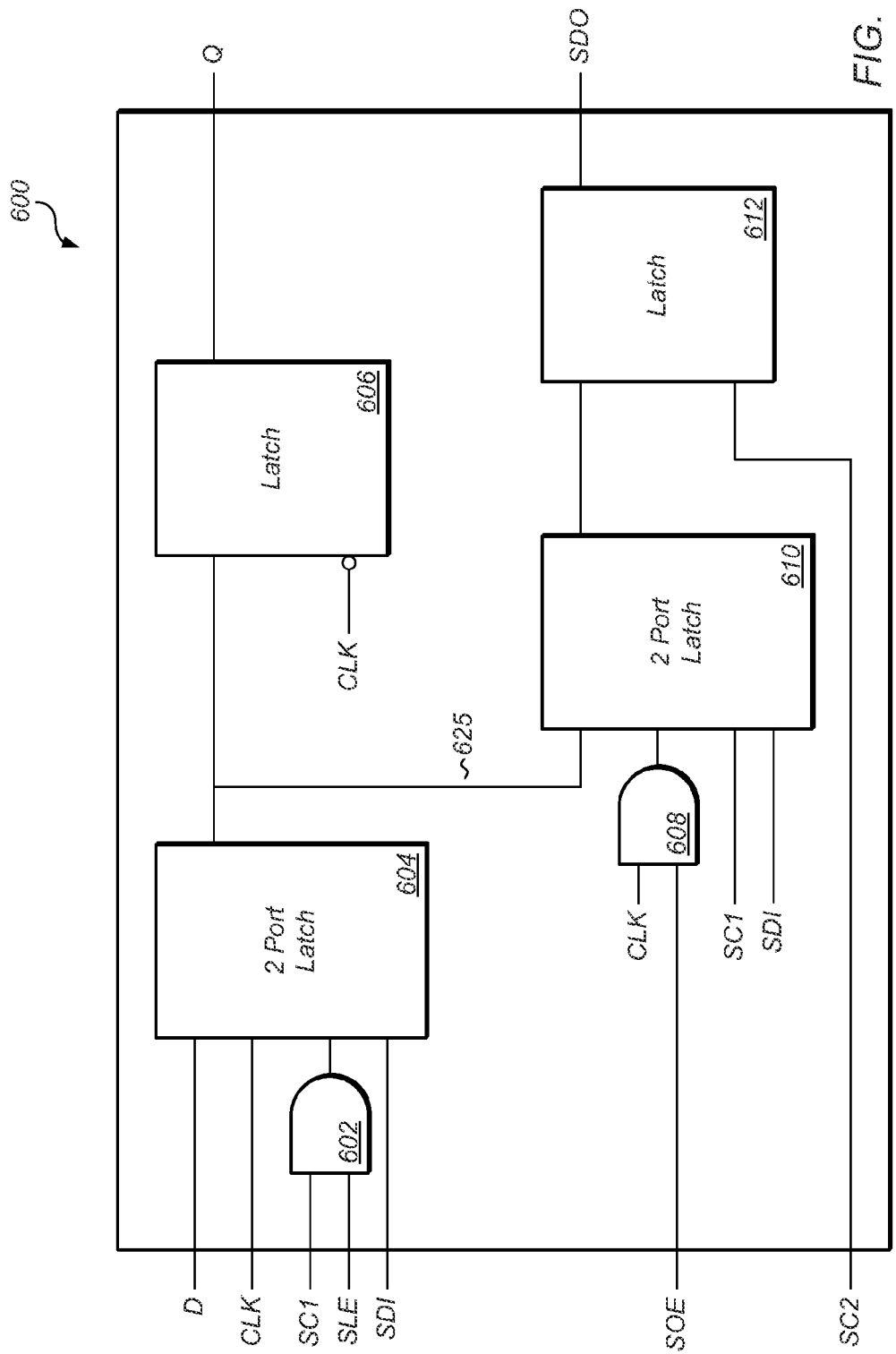
FIG. 6 is a logic diagram of another embodiment of an LSSD (level sensitive scan device) scan element.

FIG. 6 is a logic diagram of a negative-edge triggered embodiment of an LSSD-type scan element. Scan element 600 in the embodiment shown is configured to operate similarly to scan element 500 discussed above. However, this particular embodiment is configured to toggle the functional output Q on the falling edge of the clock signal. In the embodiment shown, latch 606 is configured to be active when CLK Is low, while 2 Port Latch 604 is configured to be active when CLK is high. Accordingly, data may be loaded into 2 Port Latch 604, via the D input, when CLK is high, with the corresponding output data being provided when CLK falls low.

As will be apparent to those skilled in the art, 2 Port Latch 604 and latch 606 may form a master and slave, respectively, of a functional flop. Similarly, a 2 Port Latch 610 and latch 612 may form a master and slave, respectively, of a scan flop. Data may be conveyed to or from 2 Port Latch 610 via an intermediate node 625 coupled between 2 Port Latch 604 and Latch 606. The functional flop may be configured to receive data from the scan flop when SC1 and SLE are both asserted, as may be indicated by the output of AND gate 602. Similarly, the scan flop may be configured to receive data from the functional flop when SOE and CLK are both asserted, as indicated by the output of AND gate 608. Data may be loaded into 2 Port Latch 610 from the SDI pin when SC1 is high. Data from 2 Port Latch 610 may be loaded into latch 612 when SC2 is high.

Operation in a Scan Flush Reset mode, the Scan Toggle Reset mode, and the Scan Flush/Toggle Reset mode may be accomplished in the embodiment shown using the same signal states as discussed above for the embodiment of FIG. 5. Similarly, other modes (e.g., Full Scan, No Scan, Scan Shift Protect) may be implemented on the embodiment shown using the same signal combinations as described above. However, it is noted that the embodiment of FIG. 6 as well as those discussed previously are exemplary, and that modes that are operated based on different signal combinations are also possible and contemplated.

Figure 7:
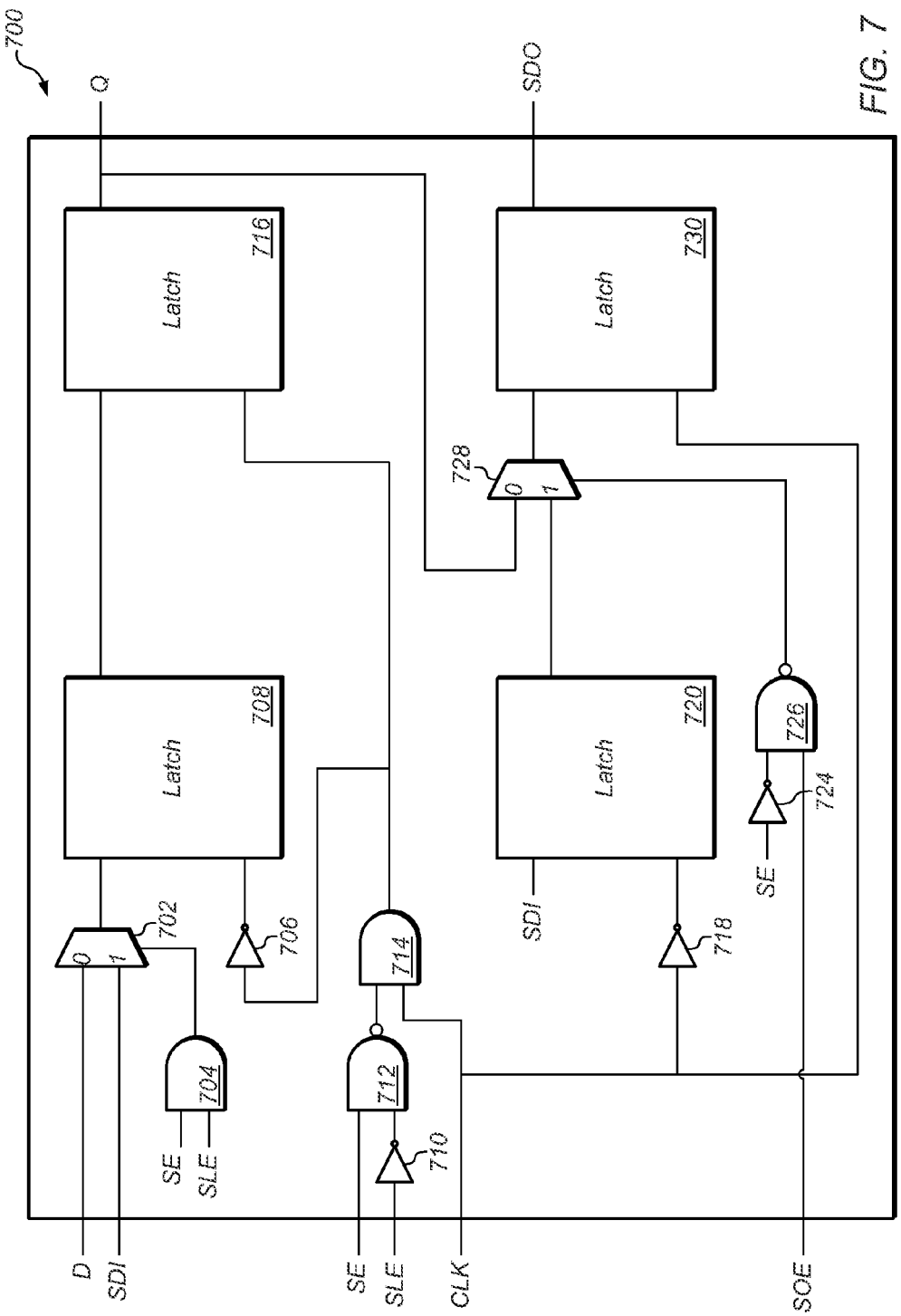
FIG. 7 is a logic diagram of one embodiment of a mux-D (multiplexer-D) type scan element.

FIG. 7 is a logic diagram of one embodiment of a mux-D (multiplexer-D) type scan element. In the embodiment shown, scan element 700 includes a functional flop including latches 708 and 716 (master and slave, respectively), and a scan flop including latches 720 and 730 (also master and slave, respectively). Latches 708 and 720 in the embodiment shown are configured to be active when CLK is low (due to inverters 706 and 718, respectively), while latches 716 and 730 are configured to be active when CLK is high.

In addition to having inputs for the SLE and SOE signals, scan element 700 also has a signal input for a scan enable (SE), which, when asserted, may allow for operation in the various scan modes. When SE is asserted, scan element 700 may operate in various ones of the scan modes discussed above. When SE is not asserted, scan element 700 may operate as a functional flop.

When operating in a scan mode (i.e. when SE is asserted) and SLE is de-asserted, latches 708 and 716 may be inhibited from operating since the clock signals provided thereto may thus be inhibited. In the embodiment shown, when SE is asserted and SLE is de-asserted (causing the complement of SLE provided by inverter 710 to be sserted), a logic 0 is provided on the output of NAND gate 712, thereby causing a logic 0 to be provide on the output of AND gate 714, regardless of the state of the clock signal. However, if SLE is asserted while SE is also asserted, the output of NAND gate 712 may then toggle to a logic 1, thereby causing the output of NAND gate 714 to follow CLK. Thus, in order to load data from the SDI pin into latch 708 in the embodiment shown, both the SE and SLE signals are asserted. Responsive to the assertion of both of these signals, AND gate 704 may provide a logic 1 as an output, thereby selecting the SDI input of multiplexer 728. Otherwise, if either of SE or SLE is de-asserted, multiplexer 702 may select the D input. Accordingly, operation in a Scan Shift Protect Mode in the embodiment shown may be accomplished by de-asserting SLE during scan shifting.

In order to shift data through the scan flop from SDI to SDO in the embodiment shown, both the SOE and SE signals are asserted (and thus the complement of SE is de-asserted via inverter 724). This may result in a logic 1 output from NAND gate 726, thereby causing the output of latch 720 to be selected by multiplexer 728. Otherwise, when either SOE or SLE is low, the output of NAND gate 762 may be high, thereby selecting the Q output provided by latch 716.

Since latches 720 and 730 operate on different phases of the same clock cycle in this embodiment, no Scan Flush Reset or Scan Flush/Toggle Reset modes are possible. However, embodiments are possible and contemplated wherein additional logic may be provided in order to enable these modes. Furthermore, scan element 700 may be reset using the Scan Toggle Reset Mode by asserting the SOE and SE signals and cycling the CLK signal.

Although not explicitly shown, scan element 700 may include a feedback path. In one embodiment, a feedback path may be present within latch 708 in order to retain any data loaded therein. Another embodiment is possible and contemplated wherein a feedback path exists between latch 716 and latch 708, which may be active when either SE or SLE is low.

Various other modes described above may be possible using the configuration of scan element 700 shown above. As noted above, the Scan Shift Protect mode may be accomplished by holding SLE low during scan shifting (while asserting SOE and SE), and allowing SLE to assert only when ready to load data into latch 708. A Full Scan Mode may be accomplished by asserting both SLE and SOE when SE is asserted and CLK is cycling. The Scan Load Only mode may be accomplished by asserting SLE and SE, while holding SOE de-asserted. The Scan Observe Only mode may be accomplished by asserting SE and de- while holding SOE SLE low, thereby allowing observation of the Q output of latch 716 but not allowing a load of latch 708 via the SDI pin.

It should be noted that while the above embodiments have been described with reference to certain logic levels and the terms "asserted" and "de-asserted" the disclosure is not intended to limit any embodiment to specific signal states or logic levels. Accordingly, numerous variations of the embodiments described herein are possible and contemplated, using various signals having logic levels that may be high or low, and that may cause various functions to be performed either by being asserted or de-asserted. Furthermore, while the schematic diagram shown in FIG. 4 has been described using PMOS transistors and NMOS transistors in various locations, it will be understood by those skilled in the art that substitutions of PMOS transistors for NMOS transistors and vice versa may be possible in some circuit configurations, and that circuits falling within the scope of this disclosure may be designed using any particular type of transistor to accomplish the functions described herein. It is also noted that while various embodiments have been described in the context of D-flip flops, embodiments using other types of flip-flops may also fall within the scope of this disclosure.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A scannable flop circuit comprising:
  a functional flop having a data input, a clock input, and a data output;
  a scan flop, the scan flop having a scan data input and a scan data output; and
  a mode select circuit coupled between the functional flop and the scan flop, wherein the mode select circuit includes:
    a plurality of mode signal inputs;
    a first buffer configured to, when activated, convey signals from the functional flop to the scan flop and further configured to, when deactivated, inhibit signals from being conveyed from the functional flop to the scan flop;
    a second buffer configured to, when activated, convey signals from the scan flop to the functional flop and further configured to, when deactivated, inhibit signals from being conveyed from the scan flop to the functional flop; and
    a keeper coupled to the data output and configured to, when activated, hold a logic value on the data output of the functional flop;
  wherein the mode select circuit is configured to, depending on a state of each of a plurality mode signals received at respective ones of the plurality of mode signal inputs, wherein each of the plurality of mode signals corresponds to a respective one of a plurality of modes:
    activate the first buffer responsive to assertion of a first one of the plurality of mode signals;
    activate the second buffer responsive to assertion of a second one of the plurality of mode signals; and
    activate the keeper responsive to de-assertion of the second one of the plurality of mode signals when a clock signal received on the clock input of the functional flop is in a first phase.

2. The scannable flop circuit as recited in claim 1, wherein the plurality of modes includes a full scan mode, and wherein the mode select circuit is configured to, when operating in the full scan mode, convey test stimulus data from the scan flop to the functional flop prior to conducting a test, and further configured to convey test result data to the scan flop subsequent to conducting the test.

3. The scannable flop circuit as recited in claim 1, wherein the plurality of modes includes a scan load mode, wherein the mode select circuit is configured to, when operating in the scan load mode, convey test stimulus data from the scan flop to the functional flop and inhibit the functional flop from conveying data to the scan flop.

4. The scannable flop circuit as recited in claim 1, wherein the plurality of modes includes a scan observe mode, wherein the mode select circuit is configured to, when operating in the scan observe mode, to inhibit the scan flop from providing test stimulus data to the functional flop and further configured to enable the functional flop to provide data to the scan flop.

5. The scannable flop circuit as recited in claim 1, wherein the plurality of modes includes a bypass mode, wherein the mode select circuit is configured to, when operating in the bypass mode, inhibit the scan flop from providing data to the functional flop and inhibit the functional flop from providing data to the scan flop.

6. The scannable flop circuit as recited in claim 1, wherein the scan flop includes a first scan clock input and a second scan clock input, wherein the scan flop is configured to operate in a scan flush mode when a first scan clock signal is asserted on the first scan clock input and a second scan clock signal is asserted on the second scan clock signal input, and wherein the scan flop is configured to convey a signal from the scan data input to the scan data output responsive to assertion of the first and second scan clock signals and wherein the scan data input is transparent to the scan data output when operating in the scan flush mode.

7. The scannable flop circuit as recited in claim 6, wherein the scan flop is configured to operate in a toggle reset mode, wherein the scan flop is configured to transfer a logic value from the scan data input to the scan data output responsive to alternating cycles of the first and second scan clock signals.

8. The scannable flop circuit as recited in claim 7, wherein the scan flop is configured to operate in a combined reset mode responsive to a one of the first and second scan clock signals being held to a steady state concurrent with toggling the other one of the first and second scan clock signals, wherein the scan flop is configured to, when operating in the combined reset mode, convey signals from the scan data input to the scan data output.

9. The scannable flop circuit as recited in claim 1, wherein the flop circuit is configured to operate in a protected scan mode responsive to the second one of the plurality of mode signals being de-asserted concurrent scan shifting operations, wherein during scan shifting operations in the protected scan mode, the scan flop is configured to convey signals from its scan data input to its scan data output, and wherein the mode select circuit is configured to, during scan shifting operations in the protected scan mode, inhibit the scan flop from changing a state of the data output of the functional flop.

10. An integrated circuit comprising:
one or more functional units;
at least one scan chain, wherein the at least one scan chain includes a plurality of scan elements, wherein each of the scan elements is coupled to at least one of the one or more functional units, and wherein each scan element of at least a subset of the plurality of scan elements includes:
a functional flop having a data input, a clock input, and a data output;
a scan flop, the scan flop having a scan data input and a scan data output; and
a mode select unit coupled between the functional flop and the scan flop, wherein the mode select unit includes:
a plurality of mode signal inputs;
a first buffer configured to, when activated, convey signals from the functional flop to the scan flop and further configured to, when deactivated, inhibit signals from being conveyed from the functional flop to the scan flop;
a second buffer configured to, when activated, convey signals from the scan flop to the functional flop and further configured to, when deactivated, inhibit signals from being conveyed from the scan flop to the functional flop; and
a keeper coupled to the data output and configured to, when activated, hold a logic value on the data output of the functional flop;
wherein the mode select unit is configured to, depending on a state of each of a plurality of mode signals received at respective ones of the plurality of mode signal inputs:
activate the first buffer responsive to assertion of a first one of the plurality of mode signals, wherein each of the plurality of mode signals corresponds to a respective one of a plurality of modes;
activate the second buffer responsive to assertion of a second one of the plurality of mode signals; and
activate the keeper responsive to de-assertion of the second one of the plurality of mode signals when a clock signal received on the clock input of the functional flop is in a first phase.

11. The integrated circuit as recited in claim 10, wherein the plurality of modes includes a full scan mode, and wherein the mode select unit of each of the subset of scan elements is configured to, when operating in the full scan mode, convey test stimulus data from its respective scan flop to its respective functional flop prior to conducting a test, and further configured to convey test result data from the respective functional flop to the respective scan flop subsequent to conducting the test.

12. The integrated circuit as recited in claim 10, wherein the plurality of modes includes a scan load mode, wherein the mode select unit of each of the subset of scan elements is configured to, when operating in the scan load mode, convey test stimulus data from its respective scan from to its respective functional flop and further configured to inhibit the respective functional flop from conveying data to the respective scan flop.

13. The integrated circuit as recited in claim 10, wherein the plurality of modes includes a scan observe mode, wherein the mode select unit of each of the subset of scan elements is configured to, when operating in the scan observe mode, inhibit its respective scan flop from providing test stimulus data to its respective functional flop and further configured to convey data from the respective functional flop to the respective scan flop.

14. The integrated circuit as recited in claim 10, wherein the plurality of modes includes a bypass mode, wherein the mode select unit of each of the subset of scan elements is configured to, when operating in the bypass mode, to inhibit its respective scan flop from conveying data to its respective functional flop and further configured to inhibit the respective functional flop from providing data to the respective scan flop.

15. The integrated circuit as recited in claim 10, wherein the scan flop of each of the subset of scan elements includes a first scan clock input and a second scan clock input, wherein the scan flop of each of the subset of scan elements is configured to operate in a scan flush mode when a first scan clock signal is asserted on the first scan clock input and a second scan clock signal is asserted on the second scan clock signal input, and wherein the scan flop of each of the subset of scan elements is configured to convey a signal to propagate from the scan data input to the scan data output responsive to assertion of the first and second scan clock signals, and wherein the scan data input is transparent to the scan data output when operating in the scan flush mode.

16. The integrated circuit as recited in claim 15, wherein the scan flop of each of the subset of scan elements is configured to operate in a toggle reset mode, wherein the scan flop is configured to transfer a logic value from the scan data input to the scan data output responsive to alternating cycles of the first and second clock signals.

17. The integrated circuit as recited in claim 16, wherein the scan flop of each of the subset of scan elements is configured to operate in a combined reset mode responsive to a one of the first and second scan clock signals being held to a steady state concurrent with toggling the other one of the first and second scan clock signals, wherein the scan flop of each of the subset of scan elements is configured to, when operating in the combined reset mode, convey signals from its respective scan data input to its respective scan data output.

18. The integrated circuit as recited in claim 10, wherein each of the subset of scan elements is configured to operate in a protected scan mode responsive to the second one of the plurality of mode signals being de-asserted concurrent with scan shifting operations, wherein during scan shifting operations in the protected scan mode, the scan flop of each of the subset of scan elements is configured to convey signals from its respective scan data input to its respective scan data output, and wherein the mode select circuit of each of the subset of scan elements is configured to, during scan shifting operations in the protected scan mode, inhibit its respective scan flop from changing a state of the data output of the respective functional flop.

* * * * *